United States Patent
Reinhart et al.

(10) Patent No.: US 12,124,771 B2
(45) Date of Patent: Oct. 22, 2024

(54) COMPUTER AIDED DESIGN OF CUSTOM CELLULAR LATTICE KERNELS ACCORDING TO MATERIAL PROPERTIES

(71) Applicant: Siemens Industry Software Inc., Plano, TX (US)

(72) Inventors: Wesley Reinhart, Plainsboro, NJ (US); Lucia Mirabella, Plainsboro, NJ (US); Suraj Ravi Musuvathy, Princeton Junction, NJ (US)

(73) Assignee: Siemens Industry Software Inc., Plano, TX (US)

( * ) Notice: Subject to any disclaimer, the term of this patent is extended or adjusted under 35 U.S.C. 154(b) by 872 days.

(21) Appl. No.: 17/273,869

(22) PCT Filed: Sep. 6, 2019

(86) PCT No.: PCT/US2019/049854
§ 371 (c)(1),
(2) Date: Mar. 5, 2021

(87) PCT Pub. No.: WO2020/055671
PCT Pub. Date: Mar. 19, 2020

(65) Prior Publication Data
US 2021/0319146 A1    Oct. 14, 2021

Related U.S. Application Data
(60) Provisional application No. 62/729,035, filed on Sep. 10, 2018.

(51) Int. Cl.
G06F 30/10     (2020.01)
G06F 30/27     (2020.01)
(Continued)

(52) U.S. Cl.
CPC ............. *G06F 30/10* (2020.01); *G06F 30/27* (2020.01); *G06N 3/126* (2013.01); *G06N 5/04* (2013.01); *G06N 20/20* (2019.01); *G06N 5/01* (2023.01)

(58) Field of Classification Search
CPC .......... G06F 30/10; G06F 30/27; G06F 30/23; G06N 3/126; G06N 5/04; G06N 20/20; G06N 5/01
See application file for complete search history.

(56) References Cited

U.S. PATENT DOCUMENTS

| | | | |
|---|---|---|---|
| 9,000,419 B2 | 4/2015 | Lizumi et al. | |
| 2017/0228474 A1* | 8/2017 | Benjamin | ............... G06F 30/15 |
| 2018/0018408 A1 | 1/2018 | Hitachi | |
| 2019/0061269 A1* | 2/2019 | Messner | ................. B29C 64/40 |

FOREIGN PATENT DOCUMENTS

| | | |
|---|---|---|
| CN | 101611505 A | 12/2009 |
| CN | 102231868 A | 11/2011 |

(Continued)

OTHER PUBLICATIONS

Li Dennis et al: "Design of an acoustic metamaterial lens using genetic algorithms", The Journal of the Acoustical Society of America, American Institute of Physics for the Acoustical Society of America, New York, NY, US, vol. 132, No. 4, Oct. 1, 2012 (Oct. 1, 2012), pp. 2823-2833, XP012163369.

(Continued)

*Primary Examiner* — Eunhee Kim (57) ABSTRACT

Methods and systems are disclosed for generation of cellular lattice kernels optimized by multiple objectives for highly specific targeted properties of geometry and topology rather than state of the art methods that rely on a predefined kernel library. Using a characterization of virtual kernel features, bulk material properties can be predicted using approximations from the virtual kernel rather than having to rely solely (Continued)

on experimental finite element simulations of lattice structures.

15 Claims, 5 Drawing Sheets

(51) Int. Cl.
*G06N 3/126* (2023.01)
*G06N 5/04* (2023.01)
*G06N 20/20* (2019.01)
*G06N 5/01* (2023.01)

(56) References Cited

FOREIGN PATENT DOCUMENTS

| CN | 103218529 A | 7/2013 | | |
|---|---|---|---|---|
| CN | 103246767 A | 8/2013 | | |
| EP | 3503041 A1 * | 6/2019 | ......... | G06F 17/5018 |

OTHER PUBLICATIONS

Huang X et al: "Optimal design of periodic structures using evolutionary topology optimization", Structural and Multidisciplinary Optimization, Springer, Berlin, DE, vol. 36, No. 6 Oct. 19, 2007 (Oct. 19, 2007), pp. 597-606, XP019651839.

Finn E. Donaldson et al: "Prediction of contact mechanics in metal-on-metal Total Hip Replacement for parametrically comprehensive designs and loads", Journal of Biomechanics, vol. 48, No. 10, Jul. 1, 2015 (Jul. 1, 2015), pp. 1828-1835, XP055646502.

International Search Report dated Dec. 6, 2016; Application No. PCT/US2019/049854; 4 pages.

Huang X:; "Optimal design of periodic structures using evolutionarytopology optimization"; DOI 10.1007/s00158-007-0196-1; Struct Multidisc Optim (2008); pp. 597-606.

Li Qiang et al:; "Protein crystallization prediction based on fusion of multi ☐ view featuresand random forest"; Modern Electronics Technique; Apr. 2015; vol. 38 No. 8; pp. 50-53.

* cited by examiner

COMPUTER AIDED DESIGN OF CUSTOM CELLULAR LATTICE KERNELS ACCORDING TO MATERIAL PROPERTIES

STATEMENT REGARDING FEDERALLY SPONSORED RESEARCH OR DEVELOPMENT

This invention was made with government support under the Government Prime Award No: HR0011-17-2-0015 awarded by the United States Defense Advanced Research Projects Agency (DARPA). The government has certain rights in the invention.

TECHNICAL FIELD

This application relates to computer aided design. More particularly, this application relates to designing custom cellular materials optimized for geometry and topology.

BACKGROUND

Cellular lattice materials are an attractive class of materials that facilitate the construction of ultra-light solid body components, such as by an additive manufacturing process. In addition to greatly reducing material usage and weight, cellular lattices have the advantage of being tunable because their shape is decoupled from their internal structure. Cellular lattice structures are generally designed according to a given set of material properties.

During the computer aided design process for a cellular lattice, a kernel is the fundamental unit of the lattice which defines its topological structure. A virtual lattice may be generated consisting of many instances of a kernel tessellated in space in a consistent way.

Current practices for engineering lattice materials involves selecting one kernel from a small library of pre-defined lattice kernels while focusing on optimizing geometric parameters (e.g., truss diameter and node positions) rather than topology. Some limited scope topology optimizations have been developed, but not capable of providing a lattice kernel customized according to desired material properties.

SUMMARY

Methods and systems are disclosed for computer aided design of cellular lattice kernels optimized by multiple objectives for highly specific targeted properties of geometry and topology rather than state of the art methods that rely on a predefined kernel library. In an aspect, a computer aided design system for generation of a custom cellular lattice kernel includes a memory having a plurality of application modules stored thereon, and a processor for executing the application modules. The modules include a genome engine that defines a genome of features for a kernel space unit of volume consisting of nodes and beams interconnected in geometric orientations and with topological configurations. The genome is represented by a binary code and configured to define an initial genome sequence. The genome engine includes a translation module generates a kernel candidate from the genome, the kernel candidate including features according to a Boolean translation of activated genome features. A plurality of new kernel candidates is generated from respective new genome sequences, each new kernel candidate being generated in a new kernel generation iteration. The modules further include a prediction engine that operates a machine learning-based prediction model for each kernel candidate to produce an approximated prediction of lattice structure properties for an unconstructed lattice of each kernel candidate. The prediction engine includes a characterization module that generates a characterization for each kernel candidate as a unique quantitative description of geometric and topological measurements of each kernel candidate, where the approximated prediction of lattice structure properties is a function of the characterization. The modules further include a fitness evaluator with an evaluation module that generates an evaluation score for the prediction model based on a difference between a target property value and a predicted property value, where each kernel candidate is evaluated for fitness by ranking the evaluation score against evaluation scores associated with kernel candidates of previous kernel generation iterations.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

Methods and systems are disclosed for generating a virtual kernel of a simulated cellular lattice through an iterative process using genome engine, a prediction engine, a lattice simulator, and a fitness evaluator to predict whether the kernel can construct the simulated lattice with target material properties (e.g., specific stiffness and Poisson's ratio). The iterative process finds progressively fitter candidates for kernels (i.e., kernels which provide successively better target property approximations). Unlike conventional kernel generation simulators that draw from a small library of pre-defined kernels, the process disclosed herein deploys a genome defined by greater than 100 features of a kernel space which are crossbred and mutated to generate child (offspring) kernel candidates with each iteration. The prediction engine approximations of target properties allow faster convergence to an optimized kernel by bypassing a full-scale lattice simulation for each iteration following the initial iterations.

Figure 1:
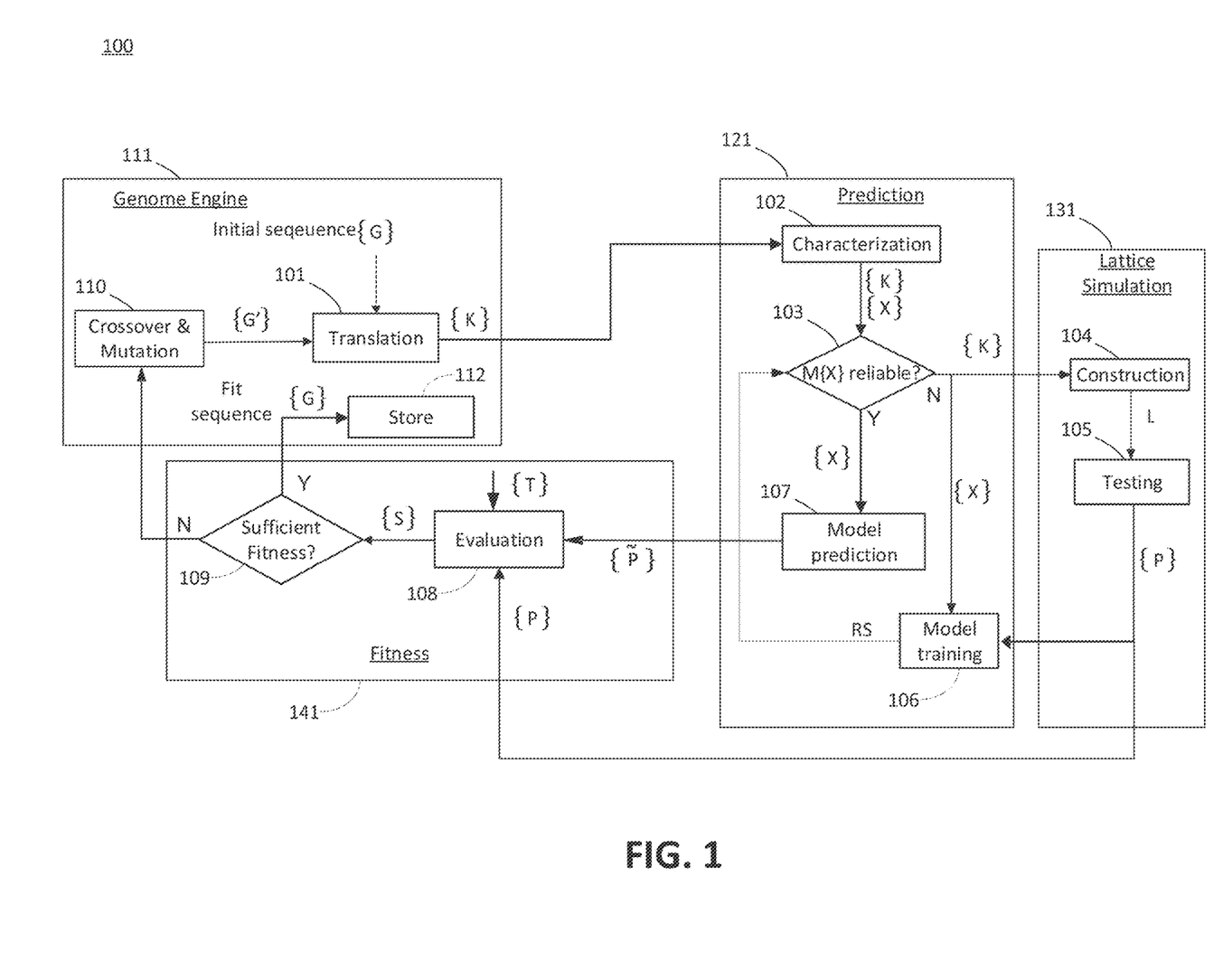
FIG. 1 shows a flowchart diagram for an example of a computer aided design system that performs custom cellular lattice kernel generation having targeted material properties according to embodiments of this disclosure.

FIG. 1 shows a flowchart diagram for an example of a computer aided design system that performs custom cellular lattice kernel generation having targeted material properties according to embodiments of this disclosure. A custom kernel generation process is executed by a computer aided design system 100 that includes genome engine 111, a prediction engine 121, a lattice simulation engine 131, and a fitness evaluator 141.

A genome is a set of prescribed independent features for constructing a virtual lattice kernel. When designing the kernel, the task may be to find a genome to construct a lattice with material properties described by target properties. Genome engine 111 defines an initial genome sequence G_1 of a genome {G} defined as a set of independent fundamental features f, where a feature f is a geometrical or topological element of a primitive lattice cell:

$$\{G\} = \{f1, f2, f3, f4 \ldots fn\}$$

The initial genome sequence may be obtained by a random generation, or selected from a library of previously generated genomes using methods described herein. Genome engine 111 includes a translation module 101 configured to generate a set of kernel candidates from the genome, each kernel candidate including features according to a Boolean translation of activated genome features. For example, a Boolean true value (fn=1) will translate as an activated feature for the kernel.

Figure 2:
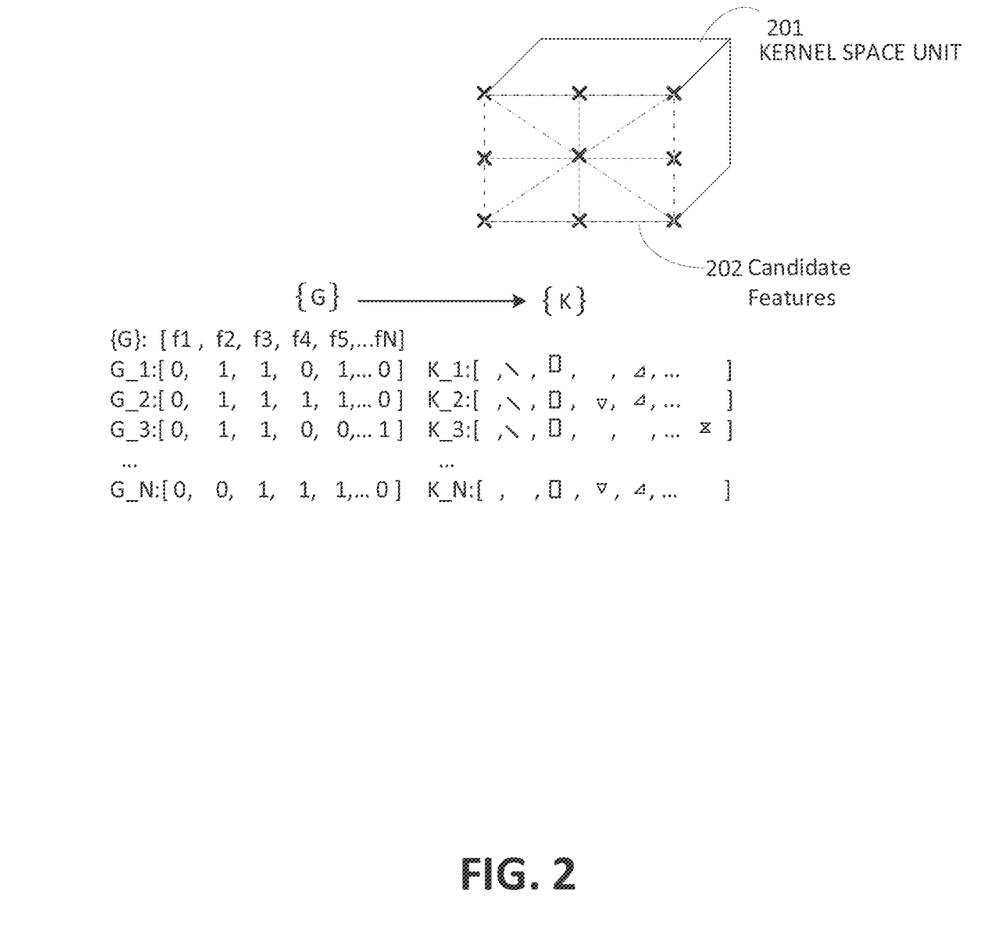
FIG. 2 shows an example of a genome to kernel translation according to embodiments of this disclosure.

FIG. 2 shows an example of a genome to kernel translation according to embodiments of this disclosure. In an embodiment, each genome sequence (G_1, G_2, ... G_N) is a binary code in which each code element represents activation or deactivation of a genome feature in the candidate kernel (K_1, K_2, K_3 ... K_N). Over the course of multiple iterations, the genome {G} evolves to converge on a set of features fn that satisfy targeted material properties. The features of kernel {K} are a translation of genome {G} defined as connected node elements of candidate features 202 within a kernel space unit of volume 201, such as a cellular unit of a simulated lattice. For efficiency, each feature fn represents only connected node elements e defined by [1<e<E] (i.e., elements for individual unconnected nodes are excluded as candidate features). In an embodiment, the limit E of feature node elements is E=6. A function for kernel {K} can be expressed as:

$$K(G) = \{f \in G\}$$

The prediction engine 121 receives the current kernel candidate (e.g., K_1) and a characterization module 102 generates a characterization {X} for the kernel candidate, which is a unique quantitative description of geometric and topological measurements of the kernel candidate. These measurements serve to reduce the complexity of the prediction task since different kernels can produce identical lattice configurations.

Figure 3:
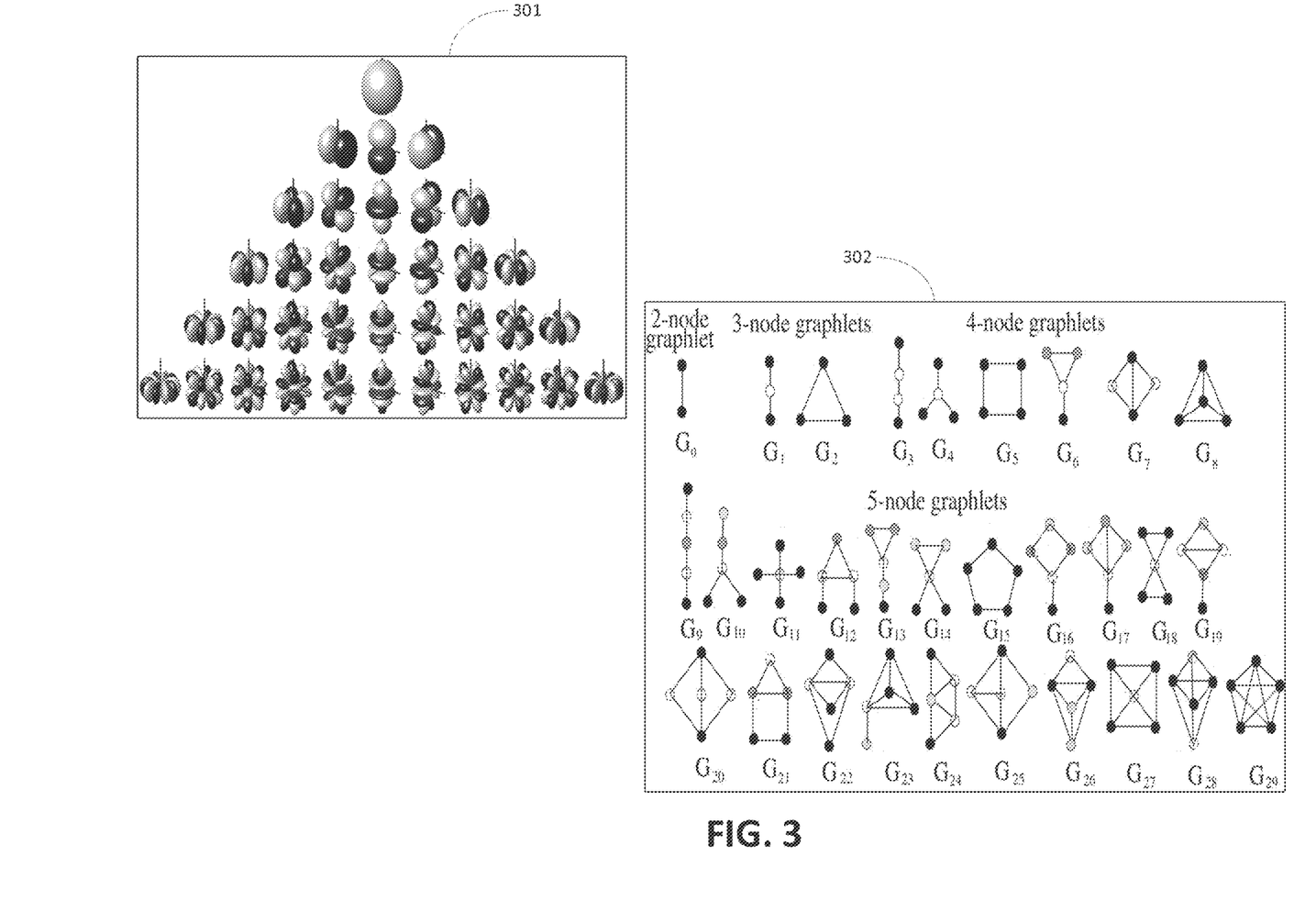
FIG. 3 shows example sets of quantitative measures for characterizations used for prediction of bulk material properties of a lattice instance according to embodiments of this disclosure.

FIG. 3 shows example sets of quantitative measures for characterizations used for prediction of bulk material properties of a lattice instance according to embodiments of this disclosure. A characterization {X} may include sets of geometric measurements, which may be based on spherical harmonics 301 that are the basis functions for a bond order that describes an angular dependence between neighboring nodes. The spherical harmonics 301 may be used to quantify the symmetries and relative orientations of each beam in the lattice instance, which are intrinsically linked to the bulk lattice properties. The characterization {X} may include sets of topological measurements, which may be in accordance with a set of defined graphlets 302. A topological description is obtained by counting the occurrence of each graphlet 302 induced in the graph representation of the lattice kernel. The characterization {X} may be a histogram of the geometric and topological measurements that provides a basis for comparing properties of kernels.

For at least a first iteration of the process 100, a lattice simulation engine 131 uses a construction module 104 to generate a simulated lattice structure L using kernel candidate {K} according to known simulation algorithms. In subsequent iterations of the kernel generation process, the lattice simulation engine 131 may be bypassed if the prediction engine 121 performs a reliability test 103 in which an approximation M{X} has a reliability score greater than a threshold. Following the lattice construction, a testing module 105 simulates stresses on the lattice structure L in order to predict properties for the lattice configuration of the candidate kernel. A predicted property vector {P}={$p_1$, $p_2$, $p_3$ ..., $p_n$} describes results of measurements of properties derived by test module 105 for the simulated lattice L. In an embodiment, each value $p_i$ is composed of key-value pairs $p_i$=(q, r), where key q represents the type of measurement, and value r represents the measurement result.

Figure 4:
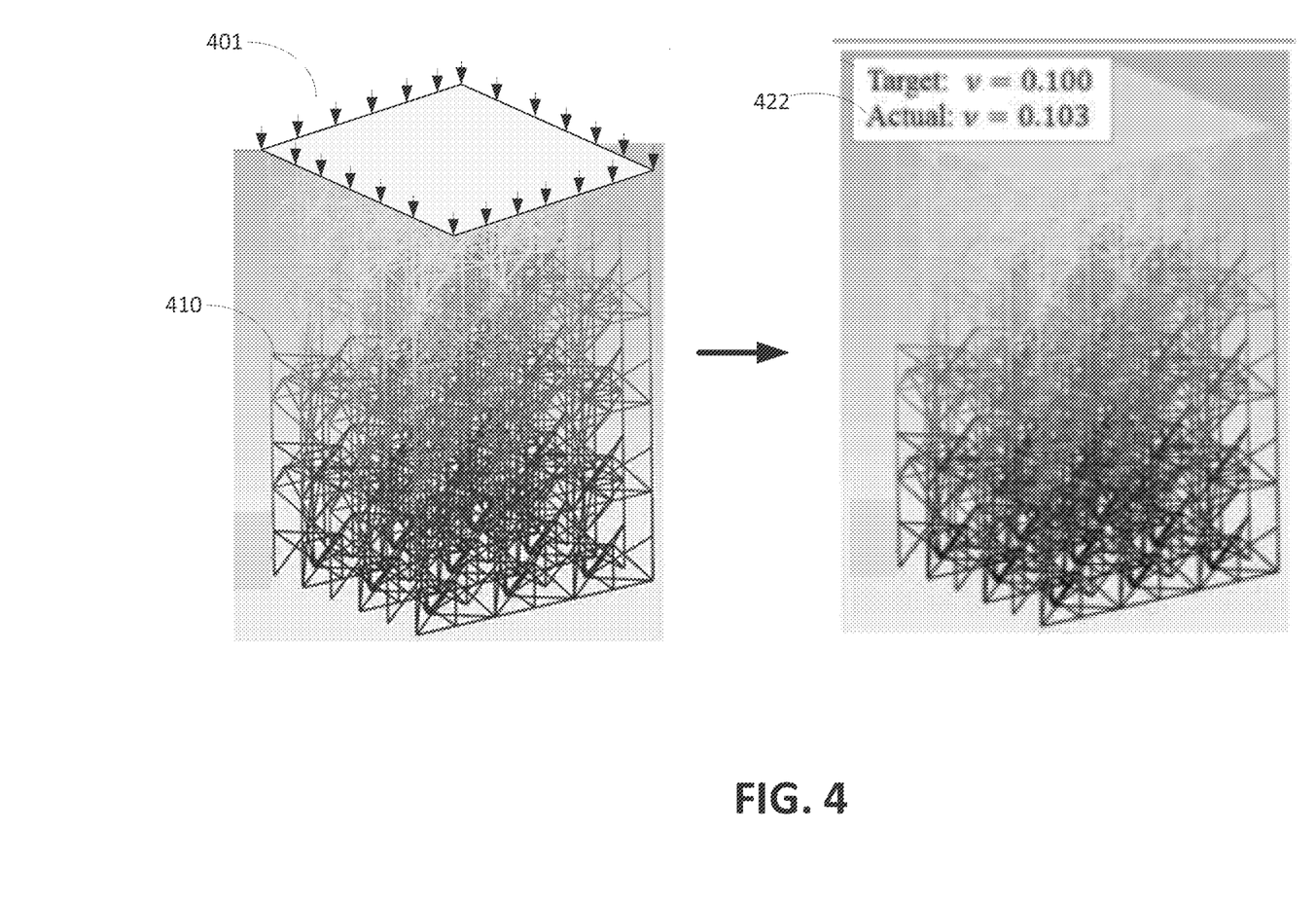
FIG. 4 shows an example a simulated lattice structure construction and testing according to embodiments of this disclosure.

FIG. 4 shows an example a simulated lattice structure construction and testing according to embodiments of this disclosure. A vertical stress load 401 is simulated on the lattice structure 410. The testing module 105 includes an algorithm that performs analysis on the structure to predict bulk material properties. While additive manufacturing of an object or component with a lattice structure typically involves printing or extrusion of one or two materials, even one material can yield many different bulk properties as required by application of the object or component produced. The testing can be performed by standard finite element simulations of stress on the lattice according to one or more defined testing protocols (e.g., to compute deformations). In the example shown in FIG. 4, a calculated value 422 is derived with a Poisson's ratio value of 0.103 (i.e., p(q, r)=(ν, 0.103)). Various other forms of stress loads may be applied by testing module 105 to calculate additional property key-value pairs.

Returning to FIG. 1, the prediction engine 121 is configured to operate a machine learning-based prediction model M{X} of the candidate kernel, which provides an approximation of the lattice properties based on the characterization {X}. The prediction model M{X} output relates to a lattice instance that may be defined for a small finite size (e.g., a dimension having less than five kernels, or a lattice instance of 3×3×3 kernels) as an approximation for a large-scale full-size lattice. If the approximation is reliable at 103 according to a reliability score threshold (e.g., after one or more iterations of the kernel generation process 100), an approximated prediction of lattice material properties {P̃} is generated by model M{X} prediction module 107 without having to simulate a lattice structure (i.e., a model-based property prediction is generated for an unconstructed lattice structure). The approximated prediction of lattice material properties {P̃} is a purely data-driven task, with no direct connection to the simulations. Rather, prediction model M{X} merely learns to reproduce properties {P} from {X} by observing trends from historical values. An approximated predicted property set {P̃} includes approximated property values, each of which is composed of key-value pairs (q̃, r̃), where key q̃ represents a type of measurement, and value r̃ represents the measurement result.

Prediction model M{X} is trained at 106 by property prediction {P} vectors of previous lattice simulations, and a reliability score RS is tracked for the prediction model M{X} which improves as more iterations of the lattice simulations are executed over the course of kernel generation iterations. If the prediction model M{X} is not reliable according to a current reliability score RS being below a threshold at the reliability test 103, then the candidate kernel is sent to the lattice simulation engine 131 for deriving a simulation-based prediction of properties {P} based on the lattice simulation as described above. This property prediction {P} may be used to train the prediction model M{X} at 106 on a condition that the prediction model M{X} fails reliability test 103. After one or more iterations of lattice simulation and training of the prediction model M{X} over one or more respective custom kernel candidate generation iterations, the reliability for prediction model M{X} improves enough for using the approximated prediction of properties {$\tilde{P}$} in place of predicted properties {P} from a costly lattice simulation. The prediction engine 121 may apply a regression technique based on supervised learning (e.g., a random forest regression, or a multi-layer perceptron) to produce the prediction model M{X}. For example, the regression may take place in a high-dimensional space defined by a large number of feature values (e.g., N geometric features and Q topological features as a vector of about 150 values), where the prediction model M{X} can generate approximated property prediction {$\tilde{P}$} from this large number of feature values.

Fitness evaluator 141 includes an evaluation module 108 for generating an evaluation score {S} for the prediction model based on a difference between a value of a target property {T} and a value of the predicted property {P} or approximated prediction {$\tilde{P}$}, whichever prediction occurred for the current iteration. In an embodiment, the evaluation score is ranked against evaluation scores associated with previously evaluated kernel candidates.

On a condition that the evaluation score meets a satisfactory threshold at 109 (i.e., when the predicted properties {P} or approximated predicted properties {$\tilde{P}$} of some lattice instance are sufficiently close to the target property {T}), the genome sequence of the candidate kernel is saved in store 112, and the optimal kernel design is achieved. Further iterations of kernel generation are then optional, otherwise the custom kernel generation process can be terminated. If the evaluation score is below the satisfactory threshold, a crossover and mutation module 110 of genome engine 111 selects two or more genome sequences of previous iterations and performs crossover and mutation operations to derive an evolved genome sequence (i.e., a child genome sequence {G'}) for the next iteration of the custom kernel generation process. The selection of the genome sequences for crossover and mutation may be according to a fitness-proportionate selection. The next kernel candidate is translated from the child genome sequence, and processed as described above for model prediction and fitness evaluation, upon which further iterations may be performed as necessary until a sufficient fitness test 109 is achieved.

Figure 5:
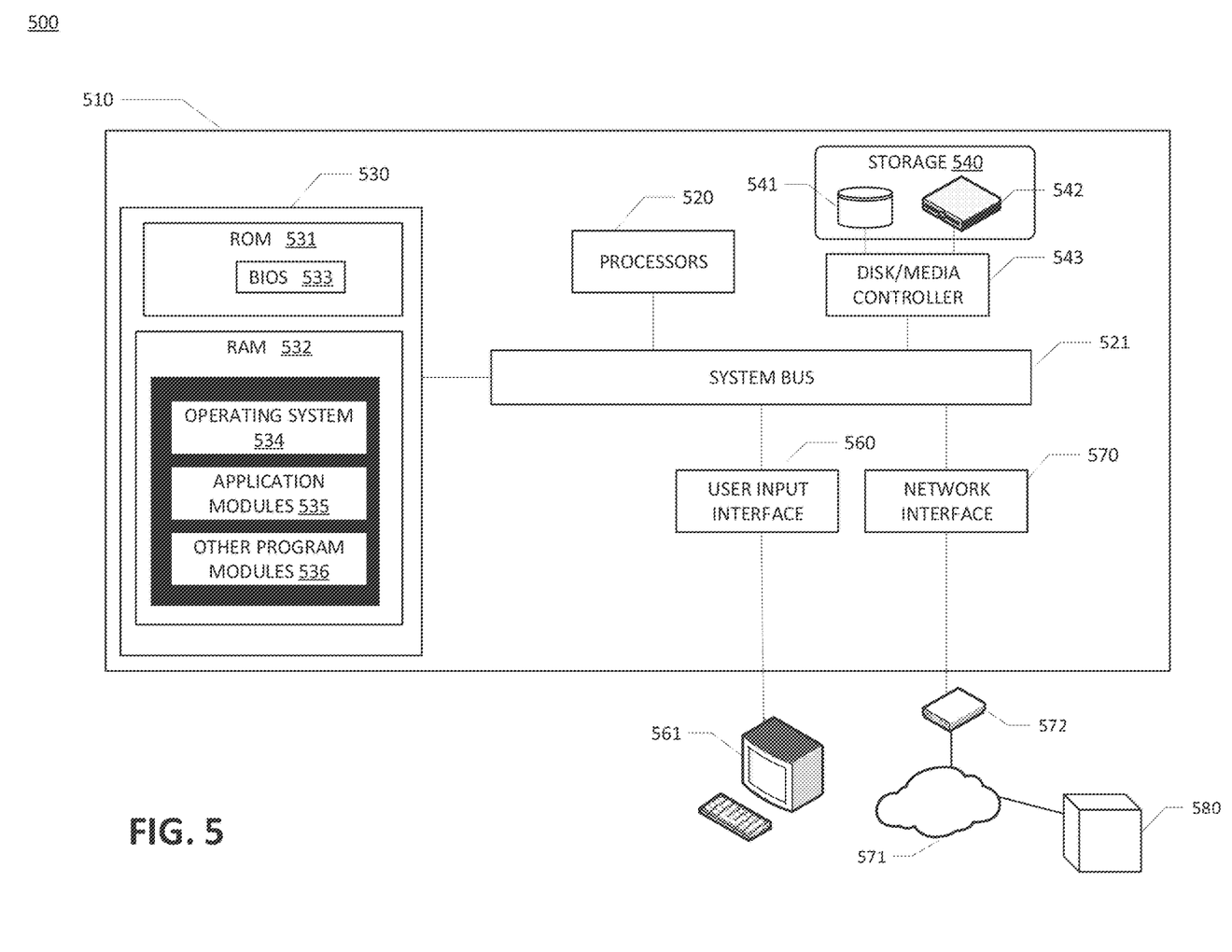
FIG. 5 shows an example of a computing environment within which embodiments of the disclosure may be implemented.

FIG. 5 illustrates an example of a computing environment within which embodiments of the present disclosure may be implemented. A computing environment 500 includes a computer system 510 that may include a communication mechanism such as a system bus 521 or other communication mechanism for communicating information within the computer system 510. The computer system 510 further includes one or more processors 520 coupled with the system bus 521 for processing the information. In an embodiment, computing environment 500 corresponds to a CAD system, in which the computer system 510 relates to a computer described below in greater detail.

The processors 520 may include one or more central processing units (CPUs), graphical processing units (GPUs), or any other processor known in the art. More generally, a processor as described herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 520 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor may be capable of supporting any of a variety of instruction sets. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

The system bus 521 may include at least one of a system bus, a memory bus, an address bus, or a message bus, and may permit exchange of information (e.g., data (including computer-executable code), signaling, etc.) between various components of the computer system 510. The system bus 521 may include, without limitation, a memory bus or a memory controller, a peripheral bus, an accelerated graphics port, and so forth. The system bus 521 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, and so forth.

Continuing with reference to FIG. 5, the computer system 510 may also include a system memory 530 coupled to the system bus 521 for storing information and instructions to be executed by processors 520. The system memory 530 may include computer readable storage media in the form of volatile and/or nonvolatile memory, such as read only memory (ROM) 531 and/or random access memory (RAM) 532. The RAM 532 may include other dynamic storage device(s) (e.g., dynamic RAM, static RAM, and synchronous DRAM). The ROM 531 may include other static storage device(s) (e.g., programmable ROM, erasable PROM, and electrically erasable PROM). In addition, the system memory 530 may be used for storing temporary variables or other intermediate information during the execution of instructions by the processors 520. A basic input/output system 533 (BIOS) containing the basic routines that help to transfer information between elements within computer system 510, such as during start-up, may be stored in the ROM 531. RAM 532 may contain data and/or program modules that are immediately accessible to and/or presently being operated on by the processors 520. System memory 530 may additionally include, for example, operating system 534, application modules 535, and other program modules 536. Application modules 535 may include aforementioned modules described for FIG. 1 and may also include a user portal for development of the application program, allowing input parameters to be entered and modified as necessary.

The operating system 534 may be loaded into the memory 530 and may provide an interface between other application software executing on the computer system 510 and hardware resources of the computer system 510. More specifically, the operating system 534 may include a set of computer-executable instructions for managing hardware resources of the computer system 510 and for providing common services to other application programs (e.g., managing memory allocation among various application programs). In certain example embodiments, the operating system 534 may control execution of one or more of the program modules depicted as being stored in the data storage 540. The operating system 534 may include any operating system now known or which may be developed in the future including, but not limited to, any server operating system, any mainframe operating system, or any other proprietary or non-proprietary operating system.

The computer system 510 may also include a disk/media controller 543 coupled to the system bus 521 to control one or more storage devices for storing information and instructions, such as a magnetic hard disk 541 and/or a removable media drive 542 (e.g., floppy disk drive, compact disc drive, tape drive, flash drive, and/or solid state drive). Storage devices 540 may be added to the computer system 510 using an appropriate device interface (e.g., a small computer system interface (SCSI), integrated device electronics (IDE), Universal Serial Bus (USB), or FireWire). Storage devices 541, 542 may be external to the computer system 510.

The computer system 510 may include a user input interface 560 or graphical user interface (GUI) 561, which may comprise one or more input devices, such as a keyboard, touchscreen, tablet and/or a pointing device, for interacting with a computer user and providing information to the processors 520.

The computer system 510 may perform a portion or all of the processing steps of embodiments of the invention in response to the processors 520 executing one or more sequences of one or more instructions contained in a memory, such as the system memory 530. Such instructions may be read into the system memory 530 from another computer readable medium of storage 540, such as the magnetic hard disk 541 or the removable media drive 542. The magnetic hard disk 541 and/or removable media drive 542 may contain one or more data stores and data files used by embodiments of the present disclosure. The data store 540 may include, but are not limited to, databases (e.g., relational, object-oriented, etc.), file systems, flat files, distributed data stores in which data is stored on more than one node of a computer network, peer-to-peer network data stores, or the like. Data store contents and data files may be encrypted to improve security. The processors 520 may also be employed in a multi-processing arrangement to execute the one or more sequences of instructions contained in system memory 530. In alternative embodiments, hard-wired circuitry may be used in place of or in combination with software instructions. Thus, embodiments are not limited to any specific combination of hardware circuitry and software.

As stated above, the computer system 510 may include at least one computer readable medium or memory for holding instructions programmed according to embodiments of the invention and for containing data structures, tables, records, or other data described herein. The term "computer readable medium" as used herein refers to any medium that participates in providing instructions to the processors 520 for execution.

A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 541 or removable media drive 542. Non-limiting examples of volatile media include dynamic memory, such as system memory 530. Non-limiting examples of transmission media include coaxial cables, copper wire, and fiber optics, including the wires that make up the system bus 521. Transmission media may also take the form of acoustic or light waves, such as those generated during radio wave and infrared data communications.

Computer readable medium instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, may be implemented by computer readable medium instructions.

The computing environment 500 may further include the computer system 510 operating in a networked environment using logical connections to one or more remote computers, such as remote computing device 580 and remote agents 581. The network interface 570 may enable communication, for example, with other remote devices 580 or systems and/or the storage devices 541, 542 via the network 571. Remote computing device 580 may be a personal computer (laptop or desktop), a mobile device, a server, a router, a network PC, a peer device or other common network node, and typically includes many or all of the elements described above relative to computer system 510. When used in a networking environment, computer system 510 may include modem 572 for establishing communications over a network 571, such as the Internet. Modem 572 may be connected to system bus 521 via user network interface 570, or via another appropriate mechanism.

Network 571 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 510 and other computers (e.g., remote computing device 580). The network 571 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 571.

It should be appreciated that the program modules, applications, computer-executable instructions, code, or the like depicted in FIG. 5 as being stored in the system memory 530 are merely illustrative and not exhaustive and that processing described as being supported by any particular module may alternatively be distributed across multiple modules or performed by a different module. In addition, various program module(s), script(s), plug-in(s), Application Programming Interface(s) (API(s)), or any other suitable computer-executable code hosted locally on the computer system 510, the remote device 580, and/or hosted on other computing device(s) accessible via one or more of the network(s) 571, may be provided to support functionality provided by the program modules, applications, or computer-executable code depicted in FIG. 5 and/or additional or alternate functionality. Further, functionality may be modularized differently such that processing described as being supported collectively by the collection of program modules depicted in FIG. 5 may be performed by a fewer or greater number of modules, or functionality described as being supported by any particular module may be supported, at least in part, by another module. In addition, program modules that support the functionality described herein may form part of one or more applications executable across any number of systems or devices in accordance with any suitable computing model such as, for example, a client-server model, a peer-to-peer model, and so forth. In addition, any of the functionality described as being supported by any of the program modules depicted in FIG. 5 may be implemented, at least partially, in hardware and/or firmware across any number of devices.

It should further be appreciated that the computer system 510 may include alternate and/or additional hardware, software, or firmware components beyond those described or depicted without departing from the scope of the disclosure. More particularly, it should be appreciated that software, firmware, or hardware components depicted as forming part of the computer system 510 are merely illustrative and that some components may not be present or additional components may be provided in various embodiments. While various illustrative program modules have been depicted and described as software modules stored in system memory 530, it should be appreciated that functionality described as being supported by the program modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. Moreover, while certain modules may be depicted and described as sub-modules of another module, in certain embodiments, such modules may be provided as independent modules or as sub-modules of other modules.

Although specific embodiments of the disclosure have been described, one of ordinary skill in the art will recognize that numerous other modifications and alternative embodiments are within the scope of the disclosure. For example, any of the functionality or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure. In addition, any operation, element, component, data, or the like described herein as being based on another operation, element, component, data, or the like can be additionally based on one or more other operations, elements, components, data, or the like. Accordingly, the phrase "based on," or variants thereof, should be interpreted as "based at least in part on."

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Each block and combinations of blocks in the Figures can be implemented by special purpose hardware-based systems that perform the specified functions or acts or carry out combinations of special purpose hardware and computer instructions.

What is claimed is:

1. A computer aided design system for generation of a custom cellular lattice kernel, comprising:
    a memory having a plurality of application modules stored thereon;
    a processor for executing the application modules comprising:
    a genome engine configured to define a genome of features for a kernel space unit of volume consisting of nodes and beams interconnected in geometric orientations and with topological configurations, wherein the genome is represented by a binary code, and configured to define an initial genome sequence, the genome engine comprising:
    a translation module configured to generate a kernel candidate from the genome, the kernel candidate including features according to a Boolean translation of activated genome features, wherein a plurality of new kernel candidates is generated from respective new genome sequences, each new kernel candidate generated in a new kernel generation iteration;
    a prediction engine configured to operate a machine learning-based prediction model for each kernel candidate to produce an approximated prediction of lattice structure properties for an unconstructed lattice of each kernel candidate, the prediction engine comprising:
    a characterization module configured to generate a characterization for each kernel candidate, wherein the characterization is a unique quantitative description of geometric and topological measurements of each kernel candidate;
    wherein the approximated prediction of lattice structure properties is a function of the characterization; and
    a fitness evaluator comprising an evaluation module configured to generate an evaluation score for the prediction model based on a difference between a target property value and a predicted property value, wherein each kernel candidate is evaluated for fitness by ranking the evaluation score against evaluation scores associated with kernel candidates of previous kernel generation iterations.

2. The system of claim 1, wherein the prediction model applies a random forest regression to produce the prediction model.

3. The system of claim 1, wherein the genome engine further comprises a crossover and mutation module configured to execute crossover and mutation of genome features of two or more genomes associated with kernel candidates selected by fitness proportionate selection to generate a new genome sequence for a next iteration of kernel generation and evaluation, on a condition that the fitness evaluator determines that the evaluation score is below a satisfactory value.

4. The system of claim 1, further comprising:
    a lattice simulation engine configured to:
        construct a simulated lattice structure from the candidate kernel on a condition that a reliability score for the prediction model is below a threshold, and
        simulate stressing on the simulated lattice structure to generate a property vector including a set of key-value pairs of measurement properties;
    wherein the property vector is used as training input for the prediction model on a condition that the reliability score for the prediction model is below the threshold.

5. The system of claim 1, wherein each feature of the kernel candidate features represents only connected node elements e defined by $[1<e<E]$, where a limit E for the node elements is $E=6$.

6. The system of claim 1, wherein the characterization includes sets of geometric measurements based on spherical harmonics that are the basis functions for a bond order that describes an angular dependence between neighboring nodes.

7. The system of claim 1, wherein the characterization includes sets of topological measurements in accordance with a set of defined graphlets, wherein a topological description is obtained by counting the occurrence of each graphlet induced in the graph representation of the kernel candidate.

8. The system of claim 1, wherein output of the prediction model relates to a lattice instance defined for a finite size as an approximation for a full-size lattice, wherein the finite size is a dimension having less than five kernels.

9. A computer implemented method for generation of a custom cellular lattice kernel, the method comprising:
    defining a genome of features for a kernel space unit of volume consisting of nodes and beams interconnected in geometric orientations and with topological configurations, wherein the genome is represented by a binary code, and configured to define an initial genome sequence;
    generating a kernel candidate from the genome, the kernel candidate including features according to a Boolean translation of activated genome features, wherein a plurality of new kernel candidates is generated from respective new genome sequences, each new kernel candidate generated in a new kernel generation iteration;
    operating a machine learning-based prediction model for each kernel candidate to produce an approximated prediction of lattice structure properties for an unconstructed lattice of each kernel candidate;
    generating a characterization for each kernel candidate, wherein the characterization is a unique quantitative description of geometric and topological measurements of each kernel candidate, wherein the approximated prediction of lattice structure properties is a function of the characterization; and
    generating an evaluation score for the prediction model based on a difference between a target property value and a predicted property value, wherein each kernel candidate is evaluated for fitness by ranking the evaluation score against evaluation scores associated with kernel candidates of previous kernel generation iterations.

10. The method of claim 9, wherein the prediction model applies a random forest regression to produce the prediction model.

11. The method of claim 9, further comprising:
    executing crossover and mutation of genome features of two or more genomes associated with kernel candidates selected by fitness proportionate selection to generate a new genome sequence for a next iteration of kernel generation and evaluation, on a condition that the fitness evaluator determines that the evaluation score is below a satisfactory value.

12. The method of claim 9, further comprising:
    constructing a simulated lattice structure from the candidate kernel on a condition that a reliability score for the prediction model is below a threshold, and simulating stressing on the simulated lattice structure to generate a property vector including a set of key-value pairs of measurement properties;

wherein the property vector is used as training input for the prediction model on a condition that the reliability score for the prediction model is below the threshold.

13. The method of claim 9, wherein each feature of the kernel candidate features represents only connected node elements e defined by [1<e<E], where a limit E for the node elements is E=6.

14. The method of claim 9, wherein the characterization includes sets of geometric measurements based on spherical harmonics that are the basis functions for a bond order that describes an angular dependence between neighboring nodes.

15. The method of claim 9, wherein the characterization includes sets of topological measurements in accordance with a set of defined graphlets, wherein a topological description is obtained by counting the occurrence of each graphlet induced in the graph representation of the kernel candidate.

* * * * *